United States Patent [19]
Anastas et al.

[11] Patent Number: 5,465,015
[45] Date of Patent: Nov. 7, 1995

[54] TRANSVERSE FIELD ACTIVATED MAGNETOSTRICTIVE MOTOR

[75] Inventors: George V. Anastas, Mountain View, Calif.; James H. Goldie, Lexington, Mass.

[73] Assignee: SatCon Technology Corporation, Cambridge, Mass.

[21] Appl. No.: 194,141

[22] Filed: Sep. 24, 1993

[51] Int. Cl.[6] ............................... H02N 2/00; H02N 2/12
[52] U.S. Cl. ........................................................ 310/26
[58] Field of Search .............................. 310/26; 318/118; 335/215

[56] References Cited

U.S. PATENT DOCUMENTS

| | | | |
|---|---|---|---|
| 4,017,754 | 4/1977 | Jarrett et al. | 310/26 |
| 4,711,977 | 12/1987 | Miyamori et al. | 178/18 |
| 4,861,149 | 8/1989 | Ealey | 350/611 |
| 5,041,753 | 8/1991 | Clark et al. | 310/328 |
| 5,052,529 | 10/1991 | Sutcliffe et al. | 188/378 |
| 5,079,460 | 1/1992 | Vranish | 310/26 |
| 5,317,223 | 5/1994 | Kiesewetter et al. | 310/26 |

FOREIGN PATENT DOCUMENTS 1501223 8/1989 U.S.S.R. ................................. 310/12

Primary Examiner—Steven L. Stephan
Assistant Examiner—Judson H. Jones
Attorney, Agent, or Firm—Iandiorio & Teska

[57] ABSTRACT

A transverse field activated magnetostrictive motor including a magnetostrictive member having a direction of motion transverse to its principal orientation axis, and a reaction surface mechanically coupled to the magnetostrictive member. A travelling magnetic field with a field component parallel to the principal orientation axis of the magnetostrictive member is provided and moved sequentially along the magnetostrictive member to sequentially, locally, decouple the member from the reaction surface to move the member in the direction of motion in relation to the surface.

10 Claims, 5 Drawing Sheets

TRANSVERSE FIELD ACTIVATED MAGNETOSTRICTIVE MOTOR

FIELD OF INVENTION

This invention relates to a transverse field activated magnetostrictive motor that accomplishes a high-torque rotary motor with inherent no-power braking.

BACKGROUND OF INVENTION

Rotary actuators are used in many applications for providing rotational motion to devices. A particular application requiring high torque and positive braking action is in the driving of robot joints. Devices currently used to drive robot joints allow joint motion when unpowered. As a result, the devices require the addition of a separate braking device, or a position control system which remains continuously active to maintain the joint in a desired position. Both solutions, however, require additional hardware and control circuitry that add to the size, weight and cost of the systems.

Magnetostrictive motors employ magnetostrictive elements as the moving element. When magnetostrictive materials are subjected to a magnetic field directed along the principal orientation axis of the magnetostrictive material, the material expands in the direction of the field lines. Incompressibility of the material requires that it compress in orthogonal directions. This behavior has been used in magnetostrictive linear actuators. Such linear actuators, however, cannot provide rotational motion without gearing or other linear to rotational translational devices that add to the complexity, cost and size of the actuators.

SUMMARY OF INVENTION

It is therefore an object of this invention to provide a transverse field activated magnetostrictive motor that directly accomplishes rotational motion of the magnetostrictive rotor.

It is a further object of this invention to provide such a motor that may be used as a rotary actuator.

It is a further object of this invention to provide such a motor that has inherent unpowered braking capabilities in a direct-drive rotary actuator.

It is a further object of this invention to provide a small, inexpensive, high-torque rotary motor particularly adapted for driving robot joints.

This invention results from the realization that a truly effective rotary motor can be accomplished with an annular magnetostrictive member having its principal orientation axis orthogonal to the member plane, and providing a travelling magnetic field sequentially around the member to cause the member to rotate to drive a rotational device coupled to the magnetostrictive rotor.

This invention consists of a transverse field activated magnetostrictive motor which may also be accomplished in a rotary magnetostrictive motor. The transverse field activated magnetostrictive motor includes a magnetostrictive member having a direction of motion transverse to its principal orientation axis, a reaction surface mechanically coupled to the magnetostrictive member, and means for providing a travelling magnetic field sequentially along the magnetostrictive member in which the field has a field component parallel to the principal orientation axis of the magnetostrictive member to sequentially, locally decouple the member from the reaction surface to move the member in the direction of motion in relation to the surface.

Preferably, the magnetostrictive member is annular for rotary movement. The annular member may be one piece or may include a number of annular segments. In this embodiment there is a gap between the ends of the annular member or the ends of adjacent segments to allow the members to rotate. The device may include a rotated member fixed to the magnetostrictive member for providing rotary motion at a point spaced from the magnetostrictive member. Preferably, the motor includes means for providing a preload force on the magnetostrictive member for increasing the member strain and braking torque. The travelling magnetic field is preferably provided by an annular polyphase coil proximate the magnetostrictive member.

The rotary magnetostrictive motor according to this invention is preferably accomplished with an annular magnetostrictive member having at least one gap and adapted for rotary motion, a reaction surface mechanically coupled to the magnetostrictive member, a rotary member fixed to the magnetostrictive member for providing rotary motion from the magnetostrictive member, and a magnetic circuit means for providing a travelling magnetic field sequentially around the annular member, in which the field has a field component parallel to the principal orientation axis of the magnetostrictive member to sequentially, locally, decouple the member from the reaction surface to rotate the magnetostrictive member and the attached rotary member. Preferably, the annular magnetostrictive member has its principal orientation axis transverse to the direction of motion so that it is moved by the constriction principle.

DISCLOSURE OF PREFERRED EMBODIMENT

Other objects, features and advantages will occur to those skilled in the art from the following description of a preferred embodiment and the accompanying drawings, in which.

This invention consists essentially of a transverse field activated magnetostrictive motor for rotary actuators having an annular magnetostrictive member with a rotary shaft affixed thereto, and reaction surfaces mechanically coupled to the magnetosrestrictive member, in which a travelling magnetic field is moved sequentially around the magnetostrictive member to cause it to rotate and i so rotate the shaft to provide 360° external rotary motion with inherent no-power locking.

There is shown in FIGS. 1A through 1D a schematic representation of magnetostrictive rod 10 sandwiched between stationary members 12 and 14. FIGS. 1A through 1D illustrate the principle employed in the preferred embodiment of this invention in which the magnetostrictive member is the motor rotor and is moved in the direction of magnetic field propagation by orienting the principal axis of the magnetostrictive material in a direction orthogonal to the direction of motion, and relying on constriction of the element in the direction of motion to produce the motion. In the stationary position, FIG. 1A, member 10 is in contact along both sides with the inner surfaces of stationary members 12 and 14. Preferably, member 10 is provided with a preload force in the direction of the applied field for increasing the strain of the magnetostrictive member, as well as its braking torque. Member 10 may be coupled to the reaction surface of members 12 and 14 by making member 10 slightly bigger than the distance between the inner surfaces of fixed members 12 and 14 so that there is an interference fit between active member 10 and members 12 and 14.

Figure 1A:
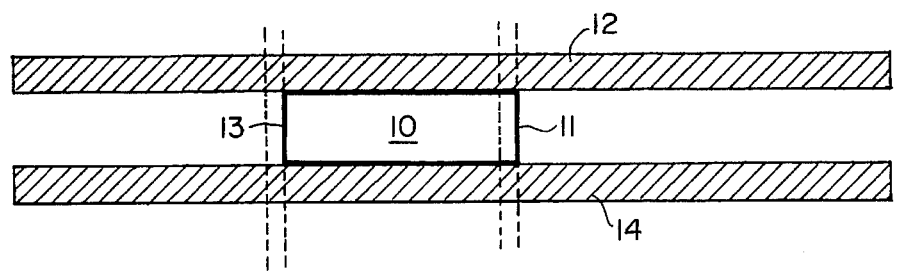
FIGS. 1A through 1D illustrate the principle used in this invention of moving a magnetostrictive member in the direction of a travelling magnetic field by applying the field to a member having its principal orientation axis orthogonal to the direction of motion.
Figure 1B:
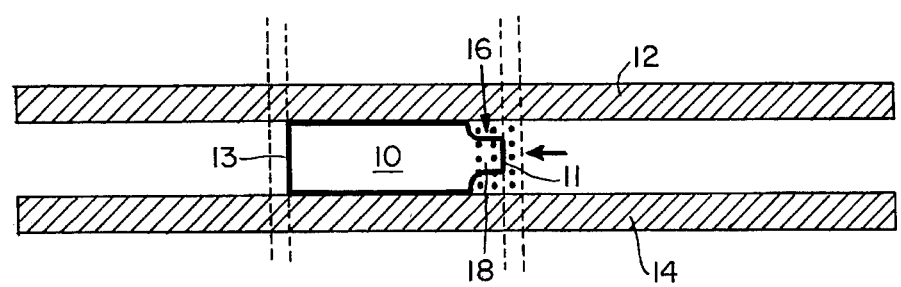
Figure 1C:
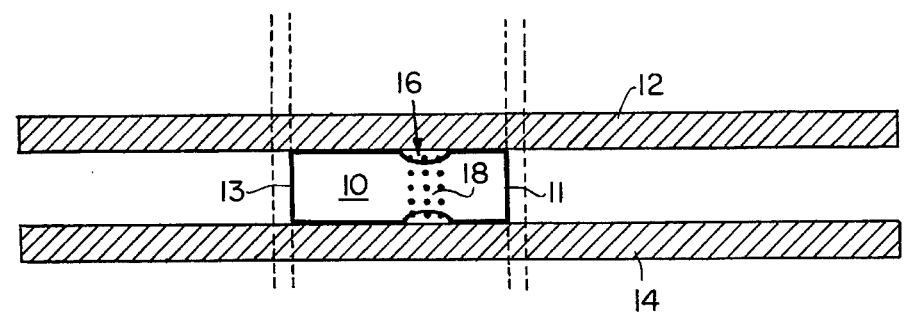
Figure 1D:
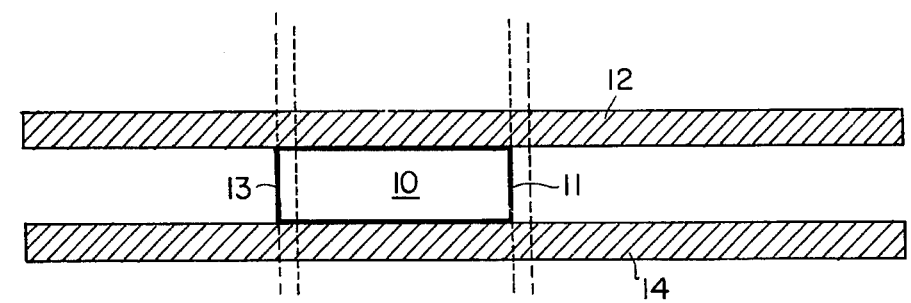

FIG. 1B illustrates the beginning of the cycling of the magnetic field applied to member 10 to cause it to move in the direction of movement of the magnetic field, to the left in these drawings. Member 10 is arranged so that its principal orientation axis is into the page, orthogonal to the direction of member motion. A magnetic field represented by arrow 16 is applied starting at the right hand side of member 10 and parallel to the member material principal orientation axis to cause member 10 to expand in the direction of the field (into the page), causing a concurrent contraction of member 10 in the two orthogonal directions as shown in FIG. 1B. This contraction frees a portion of member 10 from the inner walls of fixed members 12 and 14 as shown and constricts member 10 so that end 11 moves to the left as shown. As magnetic wave 16 travels to the left as shown in FIG. 1C, the constricted portion coinciding with the area encompassed by the wave moves along with the magnetic wave. When the wave has finished its pass through end 13, the result is the movement of member 10 to the left as shown by a comparison of FIGS. 1A and 1D.

Figure 2A:
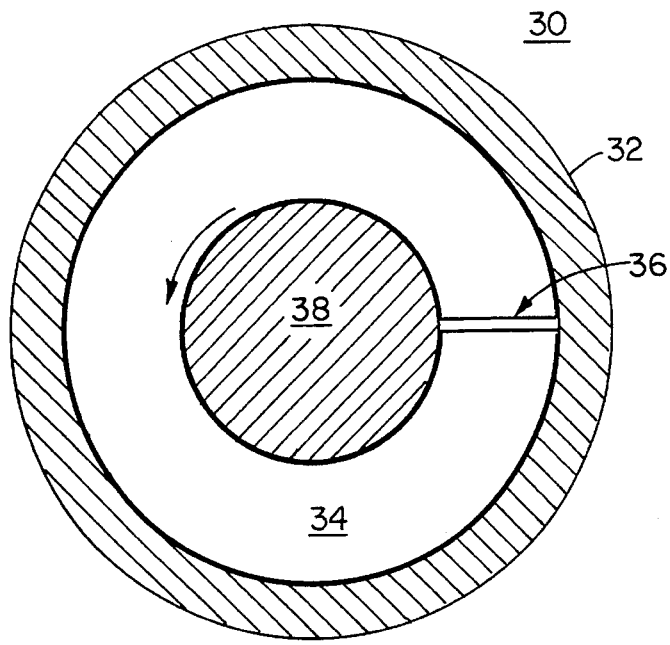
FIGS. 2A and 2B are schematic views of a rotary actuator design according to this invention employing annular magnetostrictive members.

FIG. 2A illustrates schematically rotary actuator 30 of the preferred embodiment of this invention. Actuator 30 includes annular magnetostrictive washer 34 sandwiched between reaction member 32 and reaction member 38. Member 34 has a small gap 36 between its ends to allow rotary motion as described below. A travelling magnetic field is provided around member 34 to cause member 34 to rotate through 360° within fixed member 32 to thereby cause rotation of a member, not shown, fixed to member 34. Since there is an interference fit between rotor 34 and stationary members 32 and 38, when motor 30 is in a no-power situation, member 34 is inherently braked to accomplish a high torque, small, rotary motor which is self-braking without the need for an additional braking device or a control circuit to maintain a robot rotary joint at the desired position.

Figure 2B:
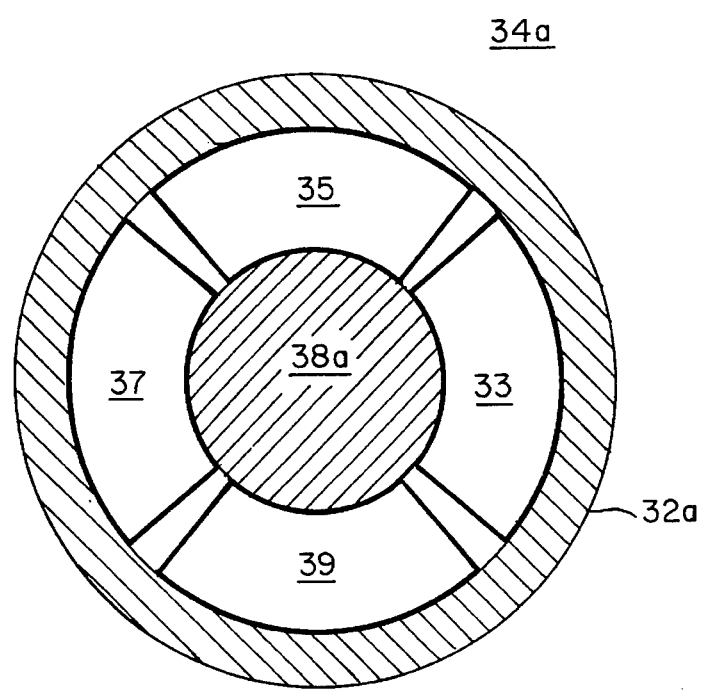

FIG. 2B illustrates an alternative construction of annular member 34a comprising spaced annular segments 33, 35, 37 and 39 that are all fitted between reaction surface member 38a and an outer reaction surface, not shown. One or more members to be rotated could be coupled to the ends of segments Such as segment 33 to cause rotation along with segments. An example of such a device would be fan or impeller blades that could be used to drive a fluid by the rotary action of the device.

Member 34 is preferably made of a giant strain magnetostrictive material such as Terfenol D made by Edge Technology. This material is formed from the rare earth terbium and dysprosium and iron which is directionally solidified to a near single crystal. The material has a maximum strain of about 2,000 microstrain. The amount of strain increases with increased compressive stress on the material in the direction of the applied magnetic field to a point, and then decreases again with even greater compressive stress. Accordingly, a preload force may be provided at a desired level to accomplish a desired strain in relation to the magnetic field strength.

Figure 3:
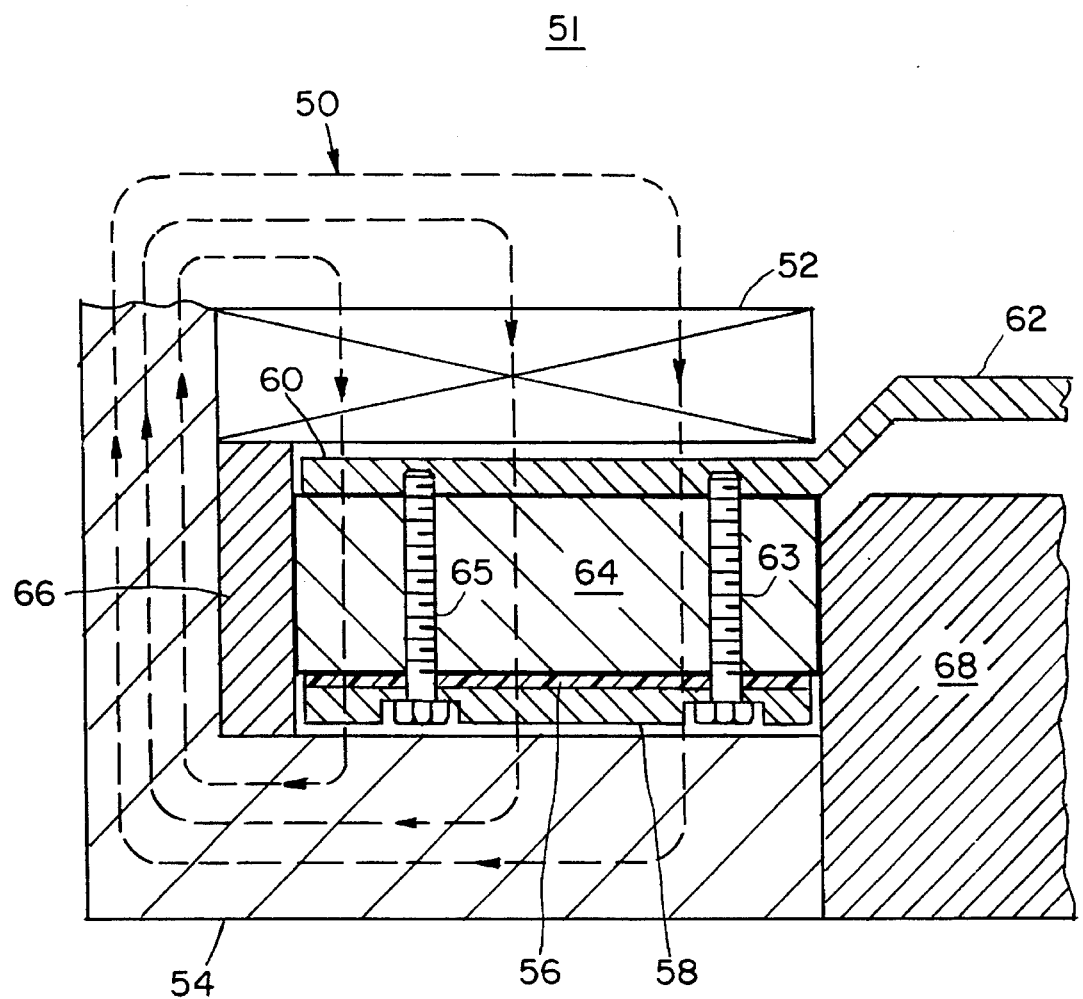
FIG. 3 is an enlarged, cross-sectional view of one half of a preferred embodiment of the invention detailing a means of preloading the active member and of coupling a rotating output shaft to the active member.

FIG. 3 shows in enlarged detail a portion of transverse field activated magnetostrictive motor 51 according to this invention. This figure illustrates the principle behind the motor including a means of applying preload force to the magnetostrictive rotor element in order to increase its strain, and also a means of coupling an output structure to the rotating member to develop output torque for a desired application.

Motor 51 includes annular magnetostrictive member 64 that moves within the annular space between fixed members 66 and 68. As described before, there is an interference fit between rotor 64 and the rotor-facing surfaces of fixed members 66 and 68 so that member 64 can travel around the annular space between annular member 66 and cylindrical member 68. Torque coupling 62 is coupled to member 64 to provide an output of motor 51. Bolts or fasteners 63 and 66 provide a preload on member 64 in the direction of magnetic field lines 50 to increase the strain in relation to the magnetic field strength. This is accomplished in this case with clamp plates 60 and 58 made of a soft magnetic material so that they can carry the magnetic field as well as the compressive force without crushing or damaging washer 64. There may be a compliant layer 56 between plate 58 and the surface of member 64, to distribute the preload uniformly. Return iron 54 provides a magnetic field return path to selectively energized coil 52 which provides the magnetic field along the principal axis of the magnetostrictive material from which rotor 64 is made.

Figure 4:
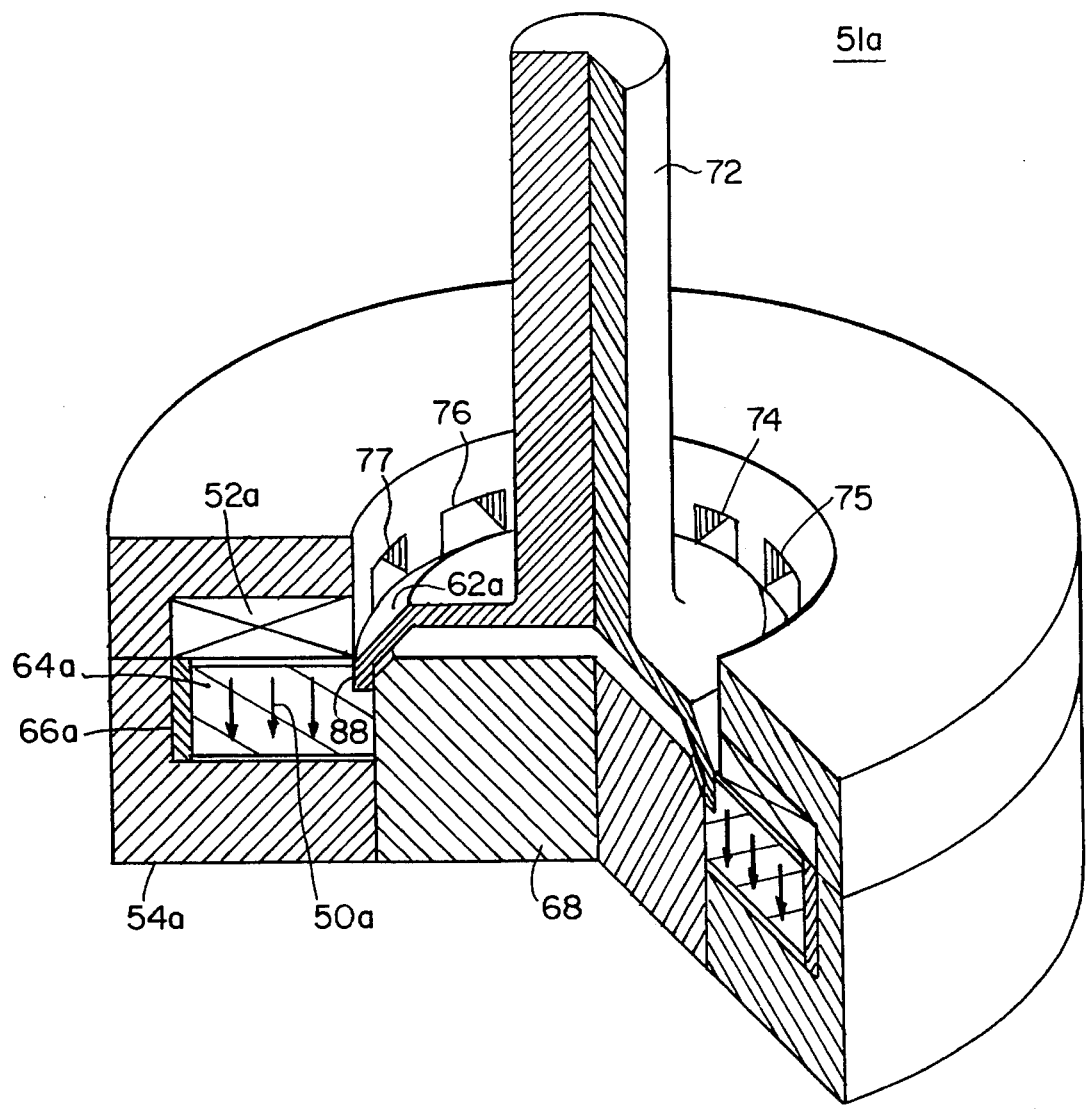
FIG. 4 is a cross-sectional view of the magnetostrictive motor of FIG. 3.

A cross sectional view of an entire motor 5 a according to this invention applying the principles discussed above is shown in FIG. 4. Annular-shaped magnetostrictive washer 64a has its principal orientation axis in the direction of arrows 50a, which is also the direction of the magnetic field selectively applied to element 64a by polyphase winding 52a which is used to produce an axially-oriented field having a sinusoidal spacial distribution, and moving circumferentially around element 64a to cause the constricted area to travel, and so cause member 64a to rotate within the annular cavity. Coil member 52a has slots such as slots 74 through 77 to hold electrical windings. Output rotating shaft 72 is coupled to rotating member 64a through torque coupling 62a that is fixed to member 64a along two sides at cut out 88. "C" shaped return iron piece 54a is provided for a flux return path.

In another embodiment, inner reaction member 68 may be replaced by a rotating member such as shaft 72 that is fixed (for example by brazing) to the inner surface of element 64a so that it rotates along with that element.

Figure 5A:
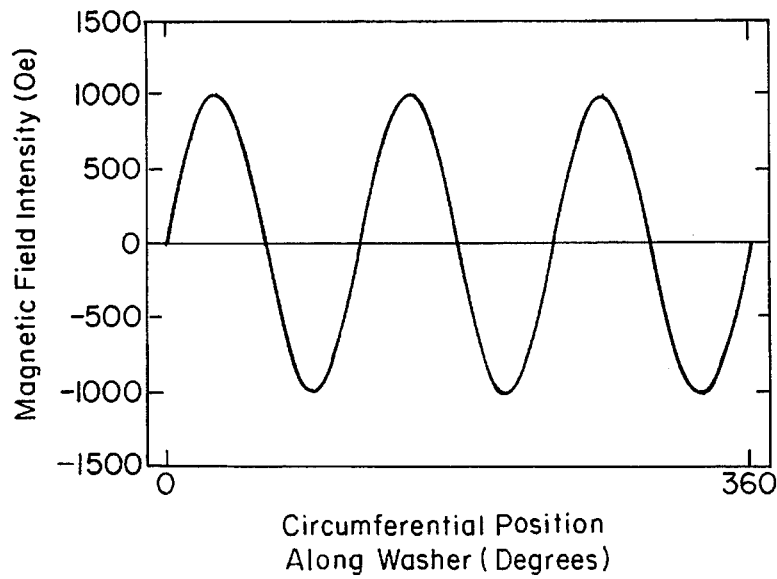
FIG. 5A is a chart of the magnetic field applied to the annular magnetostrictive rotor member at one instant of time.
Figure 5B:
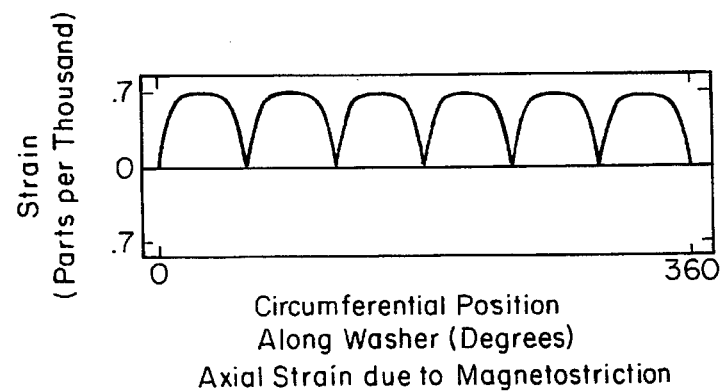
FIGS. 5B and 5C are the resulting strain in the axial and radial and circumferential directions, respectively, illustrating the principle behind the rotor member of this invention.
Figure 5C:
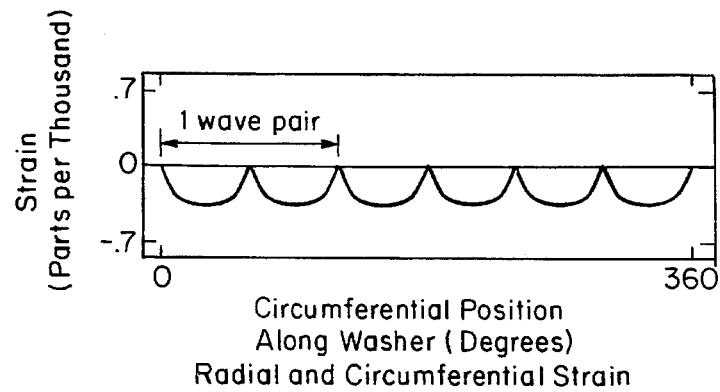

FIG. 5A shows the sinusoidal spacial distribution of a 1,000 Oersted field applied to an annular magnetostrictive member (washer) by a three phase 6-pole winding. The resultant strain in the direction of the magnetic field (axial) is shown in FIG. 5B. In the direction of motion (circumferentially), and in the radial direction, the strain will be negative, indicating material contraction, FIG. 5C. The magnitude of the strain in the radial and circumferential directions is one-half of the axial strain magnitude due to the fact that constant material volume must be maintained during the dimensional change of material due to magnetostriction. The three phase winding causes the field distribution, and hence the strain distribution, to move circumferentially around the washer. Each time a wave of negative strain moves by a fixed point on the washer, that point will move circumferentially by an amount equal to the product of the strain magnitude and the spatial length of the passing wave. Consequently, the circumferential velocity of the washer may be determined by multiplying the strain magnitude by the spatial length of a wave pair and the electrical excitation frequency. The output angular speed of the washer in revolutions per minute is then determined by the formula:

$$\Omega = \frac{v}{R} \cdot \frac{60}{2\pi}$$

where R is the radius of the midpoint of the washer and v is the circumferential velocity of the washer.

The speed at which elastic waves propagate through the magnetostrictive material from which the washer is made is the maximum speed at which this strain distribution can be driven circumferentially around the washer. This limitation establishes the maximum rotational speed which can be achieved by the motor of this invention. For a washer having a mid point radius of roughly 0.7 inches, with a material such as Terfenol D in which the spatial length times the maximum frequency is 1720 meters per second, the maximum rotational speed of the motor will be approximately 320 rpm with no preload to enhance strain.

Although specific features of the invention are shown in some drawings and not others, this is for convenience only as some feature may be combined with any or all of the other features in accordance with the invention.

Other embodiments will occur to those skilled in the art and are within the following claims:

What is claimed is:

1. A transverse field activated magnetostrictive motor, comprising:

a magnetostrictive member having a direction of motion transverse to its principal orientation axis;

a reaction surface mechanically coupled to said magnetostrictive member; and means for providing a travelling magnetic field sequentially along said magnetostrictive member, said field having a field component parallel to the principal orientation axis of said magnetostrictive member to sequentially, locally decouple said member from said reaction surface to move said member in the direction of motion of the travelling field in relation to said surface.

2. The transverse field activated magnetostrictive motor of claim 1 in which said magnetostrictive member is annular for rotary movement.

3. The transverse field activated magnetostrictive motor of claim 2 in which said annular member includes a number of spaced annular segments.

4. The transverse field activated magnetostrictive motor of claim 2 in which said annular member includes at least one gap for providing free ends to facilitate rotary movement.

5. The transverse field activated magnetostrictive motor of claim 1 further including a rotated member mechanically coupled to said magnetostrictive member for providing rotary motion at a point spaced from said magnetostrictive member.

6. The transverse field activated magnetostrictive motor of claim 1 further including means for providing a preload force on said magnetostrictive member for increasing the member strain and braking torque.

7. The transverse field activated magnetostrictive motor of claim 1 in which said means for providing a travelling magnetic field includes an annular polyphase coil proximate said magnetostrictive member.

8. A rotary magnetostrictive motor, comprising:

an annular magnetostrictive member having at least one gap and adapted for rotary motion;

a reaction surface mechanically coupled to said magnetostrictive member;

a rotary member coupled to said magnetostrictive member for providing rotary motion from said magnetostrictive member; and means for providing a travelling magnetic field sequentially around said annular member, said field having a field component parallel to the principal orientation axis of said magnetostrictive member to sequentially, locally decouple said member from said reaction surface to rotate said magnetostrictive member and said rotary member.

9. The rotary magnetostrictive motor of claim 8 in which said annular magnetostrictive member is oriented such that its principal orientation axis is transverse to the direction of motion.

10. A motor providing rotational force comprising:

a magnetostrictive element orientated with its principal orientation axis transverse to its intended direction of motion;

means for constricting said magnetostrictive element in a direction transverse to the direction of motion; and means for moving said magnetostrictive element in the direction of motion including means for providing a traveling magnetic field along said magnetostrictive element, said traveling magnetic field having a field perpendicular to the intended direction of motion.

\* \* \* \* \*